(12) United States Patent
Mandelman et al.

(10) Patent No.: US 6,261,924 B1
(45) Date of Patent: Jul. 17, 2001

(54) MASKLESS PROCESS FOR SELF-ALIGNED CONTACTS

(75) Inventors: Jack A. Mandelman, Stormville, NY (US); Heon Lee, Sunnyvale, CA (US); Young-Jin Park, Poughkeepsie, NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/489,865

(22) Filed: Jan. 21, 2000

(51) Int. Cl.⁷ .................................................. H01L 21/76
(52) U.S. Cl. ........................ 438/430; 438/296; 438/424; 257/408
(58) Field of Search .................. 438/296, 424, 438/430; 257/408

(56) References Cited

U.S. PATENT DOCUMENTS

| | | | |
|---|---|---|---|
| 4,486,266 | * 12/1984 | Yamaguchi | 438/296 |
| 4,774,206 | 9/1988 | Willer | 437/175 |
| 5,270,236 | 12/1993 | Rösner | 437/48 |
| 5,432,381 | 7/1995 | Melzner | 257/774 |
| 5,460,690 | 10/1995 | Melzner | 156/644.1 |
| 5,464,793 | 11/1995 | Roehl | 437/186 |
| 5,731,218 | 3/1998 | Melzner et al. | 437/46 |
| 5,747,373 | * 5/1998 | Yu | 438/305 |
| 5,864,155 | 1/1999 | Melzner | 257/306 |
| 5,960,318 | 9/1999 | Peschke et al. | 438/637 |
| 6,077,748 | * 6/2000 | Gardner et al. | 138/296 |
| 6,191,462 | * 2/2001 | Yu | 257/408 |

FOREIGN PATENT DOCUMENTS

304279 * 5/1997 (TW) ............................. H01L/21/28

* cited by examiner

Primary Examiner—Charles Bowers
Assistant Examiner—David S Blum
(74) Attorney, Agent, or Firm—Stanton C. Braden

(57) ABSTRACT

A method for forming self-aligned borderless contacts without a masking process, in accordance with the invention, includes forming a shallow trench isolation region about an active area region and forming a gate structure through the active area region. The gate structure and shallow trench isolation region extend above a surface of a substrate, and the substrate has an exposed portion of the between the gate structure and shallow trench isolation region. Undoped polysilicon is deposited over the gate structure, the shallow trench isolation region and the exposed portion of the substrate. The polysilicon is removed from the gate structure and shallow trench isolation region, and remaining polysilicon is doped to form contacts in contact with the substrate.

18 Claims, 7 Drawing Sheets

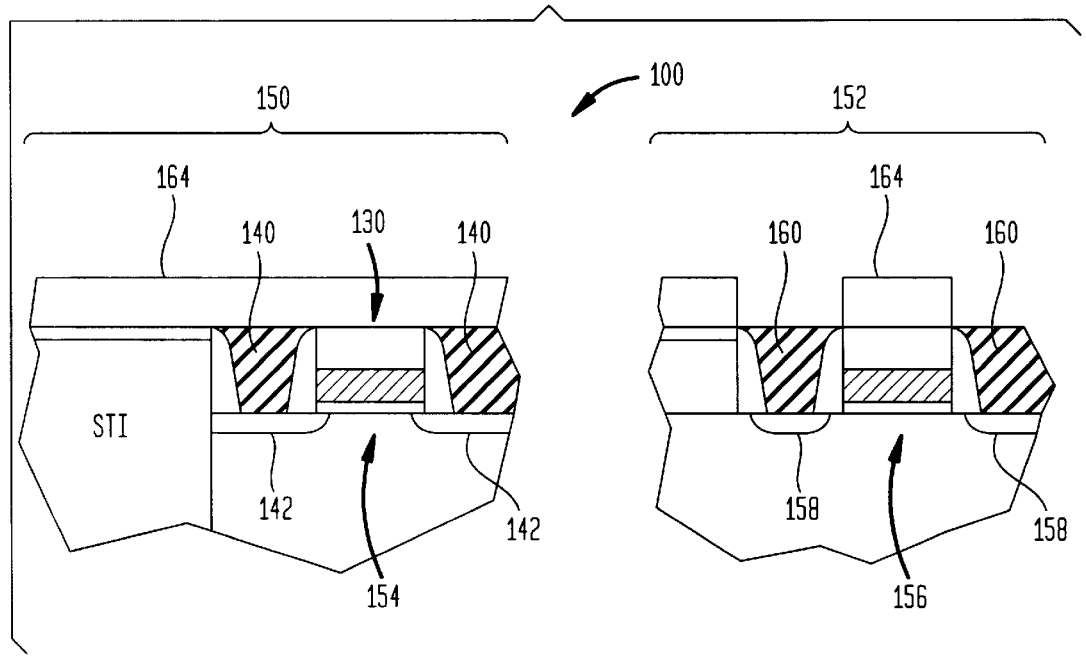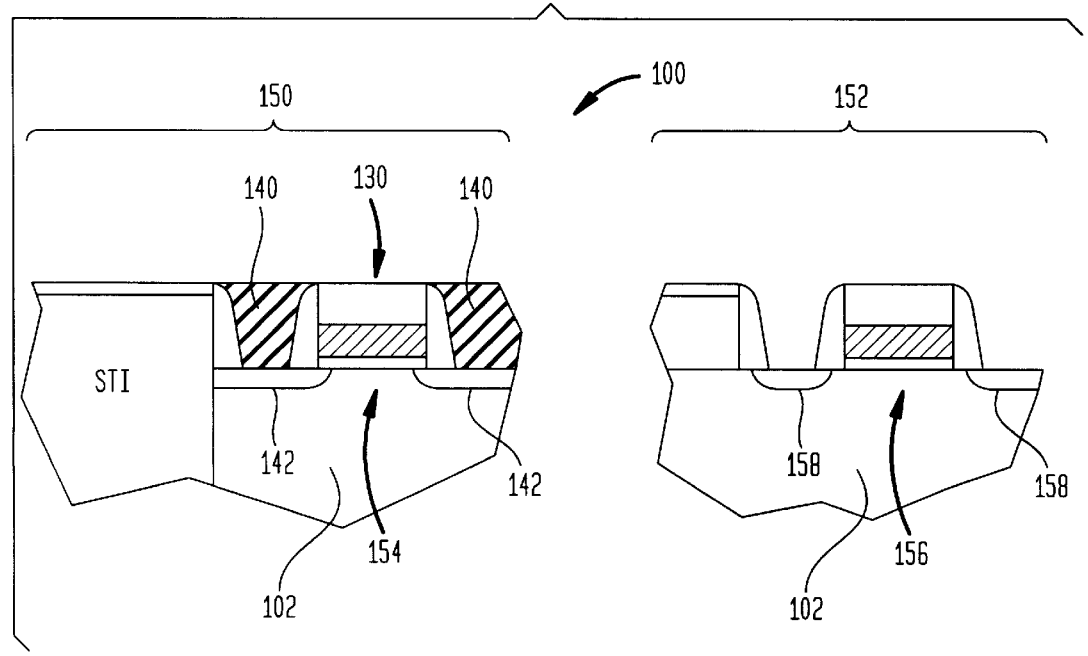

MASKLESS PROCESS FOR SELF-ALIGNED CONTACTS

BACKGROUND

1. Technical Field

This disclosure relates to semiconductor fabrication and more particularly, to a maskless process for forming diffusion contacts which are self-aligned and borderless to both gate conductors and isolation regions.

2. Description of the Related Art

To manufacture semiconductor memories, for example, dynamic random access memories (DRAM) as inexpensively as possible, it is important that innovative processes which reduce the total number of masks be sought. In the prior art, source-drain (bitline-node) diffusion contacts are provided which are borderless to an adjacent gate structure (e.g., including a wordline). The process for forming these borderless contacts with respect to the gate requires the application of a critical mask.

It should be noted that the so called "borderless" diffusion contact of conventional DRAM processes is borderless only to the adjacent gate and does overlap adjacent isolation regions. Misalignment of the contact mask and an active area mask, combined with contact overetch into adjacent isolation regions, may result in a deeper than desired junction forming along the sidewall of the active area silicon. A deeper junction degrades the short channel characteristics of a transistor (e.g., a metal oxide semiconductor field effect transistor (MOSFET)) formed in the active area silicon and increases the overall variation in threshold voltage of the transistor.

An additional concern of conventional DRAM processes is the effect of silicon defects induced in the memory array by implanted source-drain diffusions. Since these defects aggravate junction leakage mechanisms (bulk, surface and gate induced drain leakage (GIDL)), the dose of the implanted impurity (typically phosphorus or arsenic) is limited to rather small values (for example, $<1 \times 10^{14}$ cm$^{-2}$). The low doses used for the array source-drain implants contribute to increased total series resistance, which degrades performance.

Therefore, a need exists for a self-aligned maskless contact fabrication process which prevents misalignment and reduces junction degradation and leakage problems.

SUMMARY OF THE INVENTION

A method for forming self-aligned borderless contacts without a masking process, in accordance with the invention, includes forming a shallow trench isolation region about an active area region and forming a gate structure through the active area region. The gate structure and shallow trench isolation region extend above a surface of a substrate, and the substrate has an exposed portion between the gate structure and shallow trench isolation region. Undoped polysilicon is deposited over the gate structure, the shallow trench isolation region and the exposed portion of the substrate. The polysilicon is removed from the gate structure and shallow trench isolation region, and remaining polysilicon is doped to form contacts in contact with the substrate.

In other methods, the step of forming a gate structure may include the steps of depositing a first dielectric layer on a surface of the substrate, forming a channel through the first dielectric layer down to the substrate and into the trench isolation region, forming a gate dielectric layer on the substrate in the channel, depositing a gate conductor on the gate dielectric layer in the channel, and forming a cap layer on the gate conductor in the channel.

The cap layer may include oxide and the step of forming a cap layer may include the step of depositing an oxide in the channel on the gate conductor and planarizing the oxide layer to form the cap layer. The first dielectric layer may include a nitride and the step of forming a second dielectric layer on the first dielectric layer may be included. The second dielectric layer may include a nitride.

In still other embodiments, the step of depositing a gate conductor on the gate dielectric layer in the channel may include the steps of depositing the gate conductor in the channels and over the second dielectric layer, planarizing the gate conductor from the second dielectric layer by employing the second dielectric layer as a polish or etch stop and recessing the gate conductor into the channel. The step of forming a gate structure may include the step of depositing an oxide on the gate conductor and etching the oxide to insulate sides of the gate conductor. The step of depositing an oxide may include the step of oxidizing the gate conductor to further insulate sides of the gate conductor. The step of forming diffusion regions in the active area may be included. The step of forming diffusion regions in the active area preferably include the step of outdiffusing dopants implanted in the contacts into the substrate to form the diffusion regions. The method may include the steps of forming an etch stop layer over the contacts, shallow trench isolation region and the gate structure, depositing an interlevel dielectric layer on the etch stop layer, etching holes or trenches in the interlevel dielectric layer corresponding to positions of the contacts, opening the etch stop layer over the contacts, and filling the holes or trenches with conductive material for electrically connecting to the contacts.

Another method for forming self-aligned borderless contacts without a masking process includes the steps of forming a shallow trench isolation region about an active area region, implanting wells in a substrate in the active area region, and forming a gate structure over the active area region. The gate structure and shallow trench isolation region extend above a surface of the substrate, and the substrate has an exposed portion between the gate structure and the shallow trench isolation region. Undoped polysilicon is deposited over the gate structure, the shallow trench isolation region and the exposed portion of the substrate. The polysilicon is removed from the gate structure and shallow trench isolation region, and the remaining polysilicon is doped to form contacts in contact with the substrate. Dopants are outdiffused from the contacts into the substrate to form source and drain diffusion regions.

In other methods, the step of forming a gate structure may include the steps of depositing a first nitride layer on a surface of the substrate, forming a channel through the first nitride layer region down to the substrate and into the shallow trench isolation, forming a gate oxide layer on the substrate in the channel, depositing a gate conductor on the gate oxide layer in the channel, and forming an oxide cap layer on the gate conductor in the channel. The may include the step of forming a second nitride layer on the first nitride layer. The step of depositing a gate conductor on the gate oxide layer in the channel may include the steps of depositing the gate conductor in the channels and over the second nitride layer, planarizing the gate conductor from the second nitride layer by employing the second nitride layer as a polish or etch stop, and recessing the gate conductor into the channel. The step of forming a gate structure may include the step of depositing an oxide on the gate conductor and etching the oxide to insulate sides of the gate conductor. The step of depositing an oxide may include the step of oxidizing the gate conductor to further insulate sides of the gate conductor. The method may include the steps of forming an etch stop layer over the contacts, shallow trench isolation region and the gate structure, depositing an interlevel dielectric layer on the etch stop layer, etching holes or trenches in the interlevel dielectric layer corresponding to positions of the contacts, opening the etch stop layer over the contacts, and filling the holes or trenches with conductive material for electrically connecting to the contacts.

Yet another method for forming self-aligned borderless contacts without a masking process includes forming raised structures above a surface of a substrate having an exposed portion of the substrate therebetween, depositing a conductive material over the raised structures and planarizing the conductive material from top surfaces of the raised structures to form contacts in contact with the substrate which are self-aligned to the exposed portion of the substrate and are borderless with respect to the adjacent raised structures.

In other methods, the conductive material may include polysilicon, and the method may include the steps of doping the polysilicon to form contacts in contact with the substrate at the exposed portion and outdiffusing dopants implanted in the contacts into the substrate to form a diffusion region at the exposed portion. The may include the step of forming implanted junctions in the exposed portion of the substrate prior to depositing the conductive material. The raised structures may include one or more of gate structures, and trench isolations regions. The gate structures may be formed by depositing a first dielectric layer on a surface of the substrate, forming a channel through the first dielectric layer down to the substrate, forming a gate dielectric layer on the substrate in the channel, depositing a gate conductor on the gate dielectric layer in the channel, and forming a cap layer on the gate conductor in the channel. The cap layer may include oxide and the step of forming a cap layer may include the step of depositing an oxide in the channel on the gate conductor and planarizing the oxide layer to form the cap layer. The first dielectric layer may include a nitride, and the method may include the step of forming a second dielectric layer on the first dielectric layer. The second dielectric layer may include a nitride. The step of depositing a gate conductor on the gate dielectric layer in the channel may include the steps of depositing the gate conductor in the channels and over the second dielectric layer, planarizing the gate conductor from the second dielectric layer by employing the second dielectric layer as a polish or etch stop, and recessing the gate conductor into the channel. The gate structures may be formed by depositing an oxide on the gate conductor and etching the oxide to insulate sides of the gate conductor. The step of depositing an oxide may include the step of oxidizing the gate conductor to further insulate sides of the gate conductor. The method may include the steps of forming an etch stop layer over the contacts, and the raised structures, depositing an interlevel dielectric layer on the etch stop layer, etching holes or trenches in the interlevel dielectric layer corresponding to positions of the contacts, opening the etch stop layer over the contacts and filling the holes or trenches with conductive material for electrically connecting to the contacts.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 15 is a cross-sectional view of a semiconductor device having borderless self-aligned contacts formed in an array region and a support region in accordance with the present invention;

FIG. 16 is a cross-sectional view of a semiconductor device having borderless self-aligned contacts formed in an array region and removed from a support region in accordance with the present invention;

DETAILED DESCRIPTION OF PREFERRED EMBODIMENTS

The present invention includes a method for forming borderless contacts for semiconductor devices. Advantageously, the borderless contacts are formed without the use of a masking process or step. In one embodiment of the present invention, a process is included which forms contacts to the source-drain diffusions of array transistors (MOSFETs) without the need of a mask. Furthermore, the array diffusion contacts formed by the process described in this disclosure are self-aligned to, and do not overlap, adjacent gate conductor and isolation regions. The present invention will be described in terms of borderless self-aligned contacts between gate structures and trench regions, however, the present invention is also applicable to contacts formed between any structures where a contact is needed. For example, a contact may be formed in accordance with the invention between two gate structures, or between a deep trench and a gate structure, or between isolation regions, etc.

In another embodiment, the present invention teaches a process which forms the array source-drain diffusions by outdiffusion from polysilicon, instead of implantation, thus avoiding creation of silicon defects resulting from the use of junction implants in the array. Although in some embodiments, maskless contact formation may be employed after implanted junctions are formed. Further, the present invention permits the use of oxide (instead of nitride) gate spacers and insulating top cap for gate structures (e.g., wordlines), thus reducing bitline capacitance, when comparable insulator thicknesses are maintained. The present invention also keeps well diffusions from extending under the source-drain diffusions, further decreasing junction capacitance. Still another feature of the present invention is that the process is applicable to deep trench (DT) storage capacitors as well as stacked capacitors (STC) for semiconductor memory devices.

Figure 1:
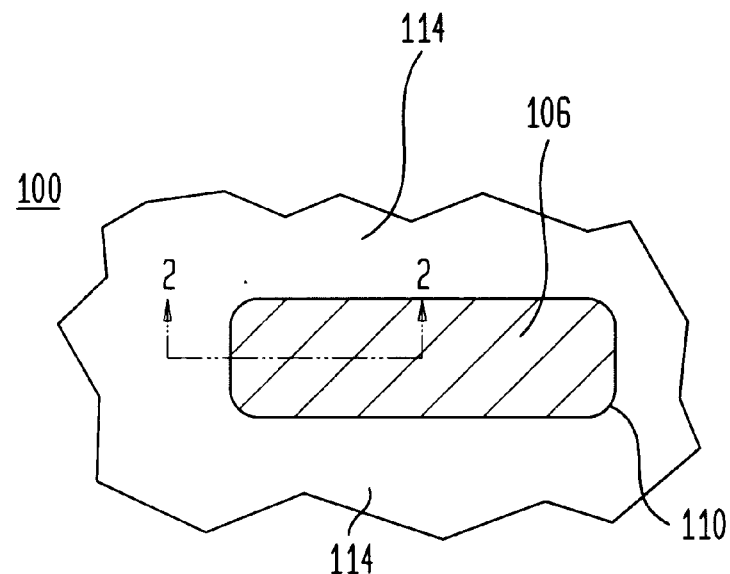
FIG. 1 is a top view of a semiconductor device having a dielectric layer formed within a shallow trench isolation region in accordance with the present invention.
Figure 2:
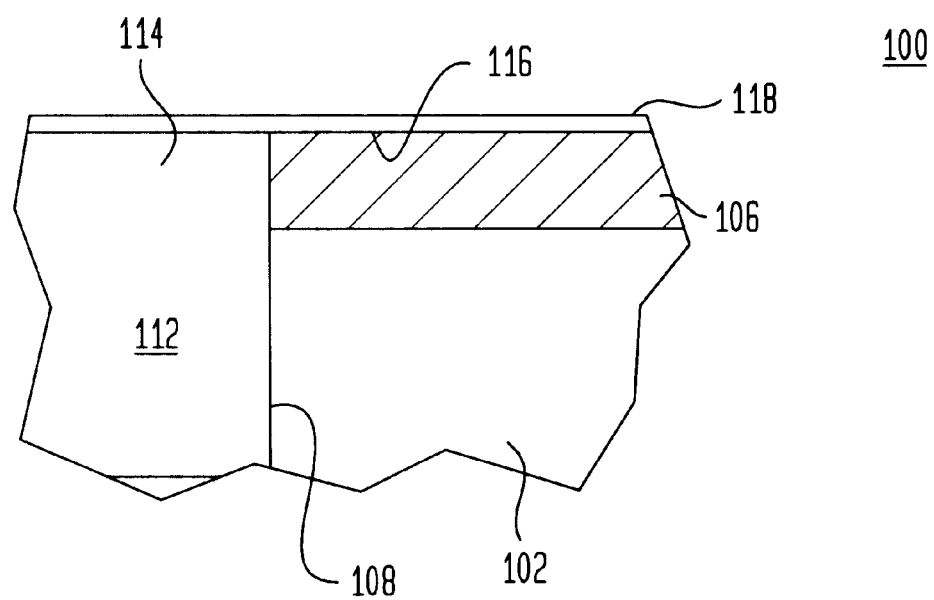
FIG. 2 is a cross-sectional view taken at section line 2—2 of FIG. 1 showing a polish/etch stop layer deposited in accordance with the present invention.

Referring now in specific detail to the drawings in which like reference numerals identify similar or identical elements throughout the several views, and initially to FIGS. 1 and 2, a partially fabricated semiconductor device 100 is shown. Device 100 may a dynamic random access memory, a static random access memory, an embedded memory chip, an application specific integrated circuit or other semiconductor device. Device 100 may preferably include a memory device employing a memory array having stacked capacitor cells or deep trench capacitor cells. A substrate 102 is provided which preferably includes monocrystalline silicon.

A dielectric layer 106 is deposited on substrate 102 which is preferably a nitride (pad nitride). It is to be understood that deep wells may optionally be formed prior to depositing dielectric layer 106. Such wells may include N or P wells implanted in substrate 102 by an ion implantation method. After deposition, dielectric layer 106 is patterned and employed to etch trenches 108, such as isolation trenches and other components, for example, deep trenches, buried bitlines, etc. (not shown). Trenches 108 are disposed to surround an active area region 110, which will be employed for the formation of at least one transistor device. Trenches 108 are filled with a filler material 112, such as, an oxide, to form shallow trench isolation regions 114 surrounding active area region 110. A top surface 116 is planarized, by employing, for example, a chemical mechanical polishing process (CMP). A polish stop or etch stop layer 118 is formed on the planarized top surface 116. Etch stop layer 118 will be employed in later steps as will be described herein below.

Figure 3:
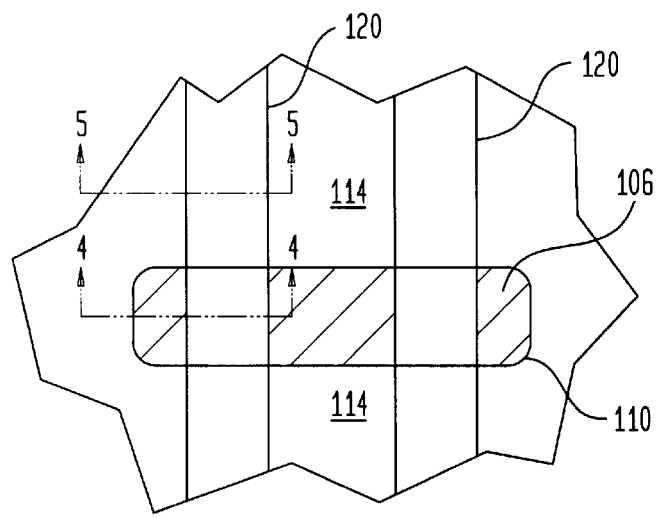
FIG. 3 is a top view of the semiconductor device of FIG. 1 having channels formed within the shallow trench isolation region and an active area in accordance with the present invention.
Figure 4:
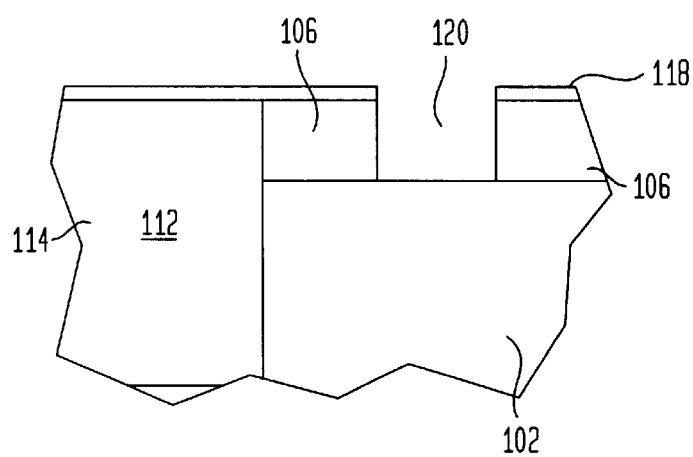
FIG. 4 is a cross-sectional view taken at section line 4—4 of FIG. 3 showing channels formed in accordance with the present invention.
Figure 5:
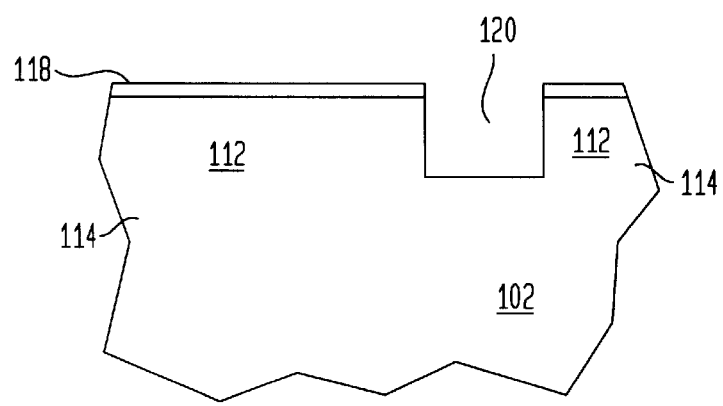
FIG. 5 is another cross-sectional view taken at section line 5—5 of FIG. 3 showing channels formed in accordance with the present invention.

Referring to FIGS. 3, 4 and 5, a gate conductor mask may be employed to pattern a resist or a hard mask (not shown), preferably, an oxide hard mask over etch stop layer 118. Using the gate conductor mask, channels 120 are etched into dielectric layer 106, regions 114 and dielectric layer 118 over active area region 110. The etching of channels 120 may be performed by an anisotropic etch process, such as, for example, a reactive ion etch (RIE) process. The etch process should be non-selective to dielectric layers 106 and 118 and non-selective to filler material 112, but selective to substrate 102.

Figure 6:
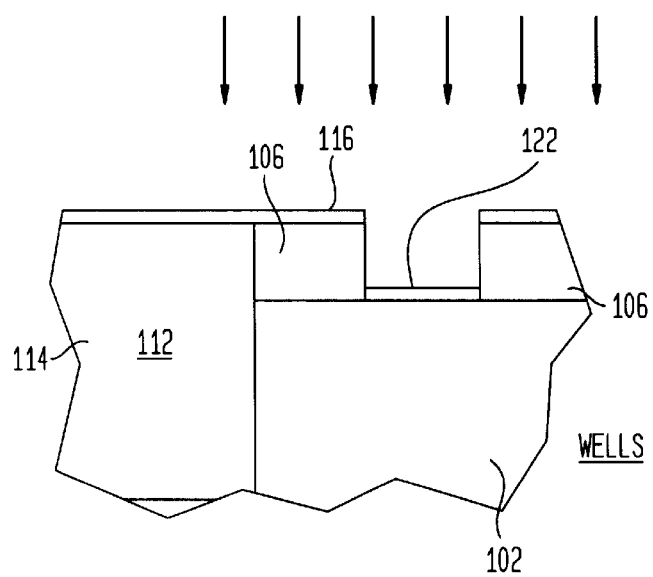
FIG. 6 is a cross-sectional view taken at section line 4—4 of FIG. 3 after a sacrificial oxide is grown and well implantation may be performed in accordance with the present invention.

Referring to FIG. 6, a sacrificial oxide layer 122 is grown on the exposed surface of substrate 102. Wells or well regions 124 are implanted using dopants with conductivity appropriate to the transistor devices to be formed. Well regions 124 are formed by implanting dopant species into substrate 102 through sacrificial oxide layer 122. The implantation does not significantly penetrate isolation material 112 and dielectric layer 106. Implantation occurs in channels 120. Other areas such as source-drain regions, which are to be formed adjacent to channels in substrate 102, are blocked by layer 106. Sacrificial oxide layer 122 is then stripped.

Figure 7:
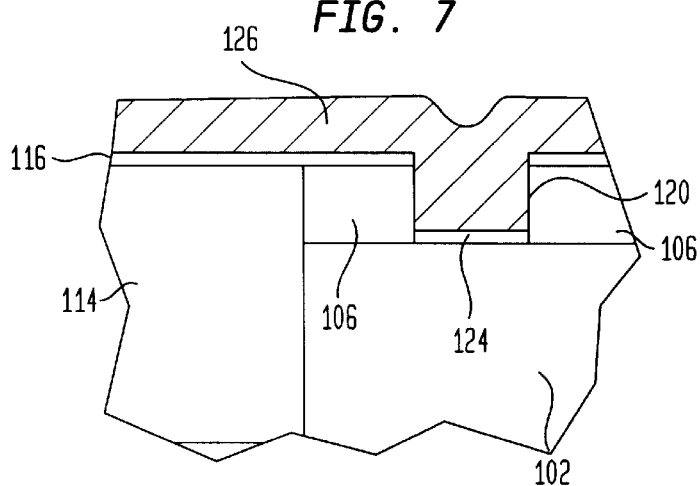
FIG. 7 is a cross-sectional of the device of FIG. 6 showing a gate conductor deposited in accordance with the present invention.
Figure 8:
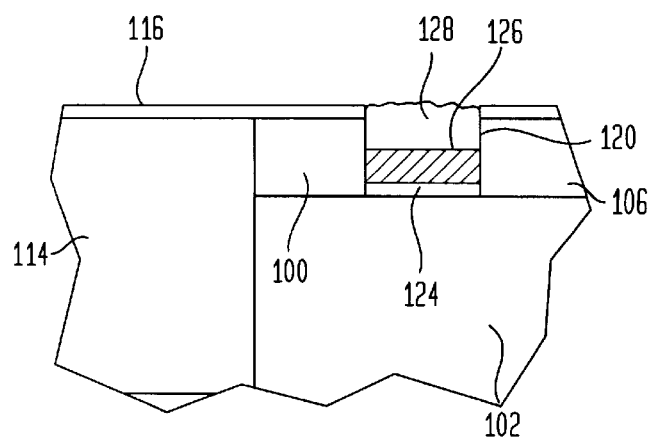
FIG. 8 is a cross-sectional of the device of FIG. 7 showing the gate conductor recessed into the channel and a protection cap formed in accordance with the present invention.

Referring to FIGS. 7 and 8, a gate oxide 124 is grown on substrate 102 in channels 120. Then, gate conductor material 126 is deposited to form gates, preferably, dual work function gates. Dual work function gates include polysilicon, which is implanted with appropriate N and P type dopants in selected gate conductor regions. Gate conductor material 126 may include polysilicon, a metal and/or a metal silicide. In one embodiment, gate conductor 126 may include an implanted polysilicon and a metal layer formed on the implanted polysilicon. Other conductive materials and combinations may also be employed. Gate conductor material 126 is planarized and recessed beneath a top surface of dielectric layer 116. A dielectric layer 128 is deposited and polished to the top surface of dielectric layer 118. Dielectric layer 128 preferably includes an oxide, and more preferably a chemical vapor deposited oxide. Dielectric layer 128 forms a dielectric cap for a gate structure 130.

Figure 9:
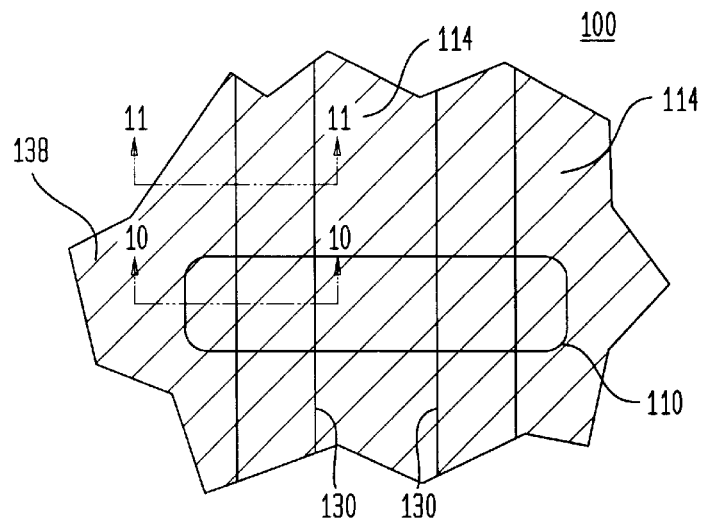
FIG. 9 is a top view of a semiconductor device having a polysilicon layer formed thereon in accordance with the present invention.
Figure 10:
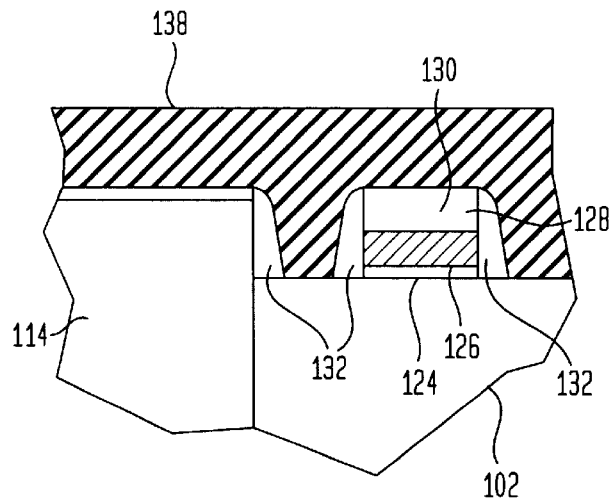
FIG. 10 is a cross-sectional view taken at section line 10—10 of FIG. 9 showing the polysilicon layer deposited and sidewall spacers formed adjacent to the shallow trench isolation and the gate structure in accordance with the present invention.
Figure 11:
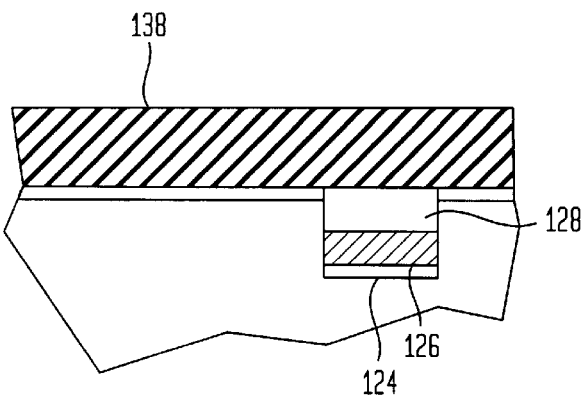
FIG. 11 is a cross-sectional view taken at section line 11—11 of FIG. 9 showing the polysilicon layer deposited in accordance with the present invention.

Referring to FIGS. 9, 10 and 11, dielectric layers 116 and 106 are removed selective to filler material 112, dielectric layer 128 and substrate 102. Gate sidewall spacers 132 are formed by depositing and anisotropically etching a dielectric layer, preferably an oxide material. In a preferred embodiment, a gate side wall oxidation process is employed, in addition to the deposited spacers 132, which provides ambient oxygen at an elevated temperature, for example, between about 700 to about 1100 degrees C to oxidize gate conductor material 126 to provide an insulating film of sufficient thickness to prevent electric current between gate conductor material 126 and contacts to be formed adjacent to gate structure 130. By employing oxide for wordline spacers 132 and protective cap 128, reduced bitline capacitance is achieved over conventional nitride spacers and caps.

A layer of undoped polysilicon 138 is deposited over device 100 and fills regions between gate structures 130 and regions 114. Find numbers in parenthesis indicate features that are obscured in FIG. 9 by layer 138. Layer 138 may alternately include a conductive material, such as a metal, for example, Tungsten. However, if metals are employed, a junction implantation step is needed first to form source and drain diffusion regions in substrate 102 where contact holes are formed. In still other embodiments diffusion barriers or other conductive layers may be formed after implantation of diffusion regions below contacts 140.

Advantageously, contacts 140 are formed borderless relative to trench regions 114 (e.g., STI) and gate structure 130.

In one embodiment, contacts 140 are self-aligned to diffusion regions 142 since diffusion regions 142 are formed by outdiffusion from the contacts 140 themselves. Further, no masking is needed to form contacts 140 since via holes are no longer patterned. Instead, polysilicon is simply deposited over device 100 and removed from unwanted areas by using a maskless planarization process.

Figure 12:
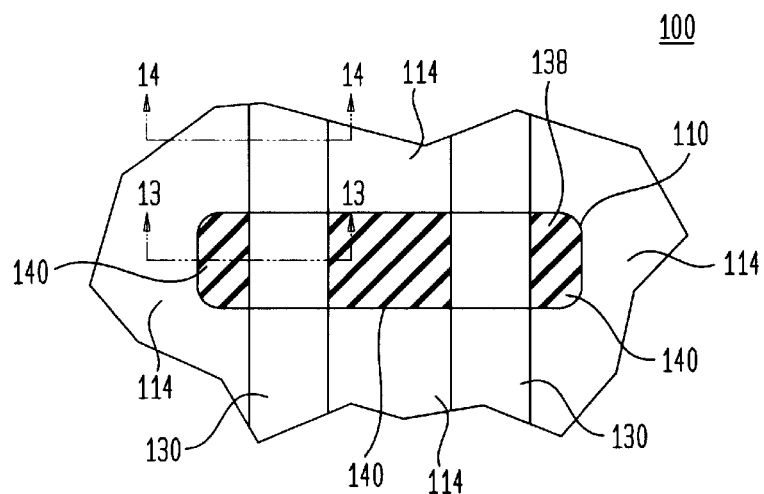
FIG. 12 is a top view of the semiconductor device of FIG. 9 having the polysilicon layer planarized and having dopants implanted in the remaining polysilicon in accordance with the present invention.
Figure 13:
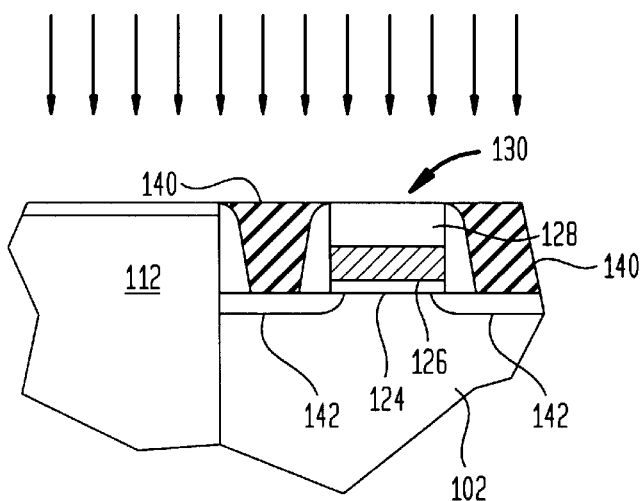
FIG. 13 is a cross-sectional view taken at section line 13—13 of FIG. 12 showing the polysilicon layer planarized and implanted with dopants to form borderless self-aligned contacts without using a mask in accordance with the present invention.
Figure 14:
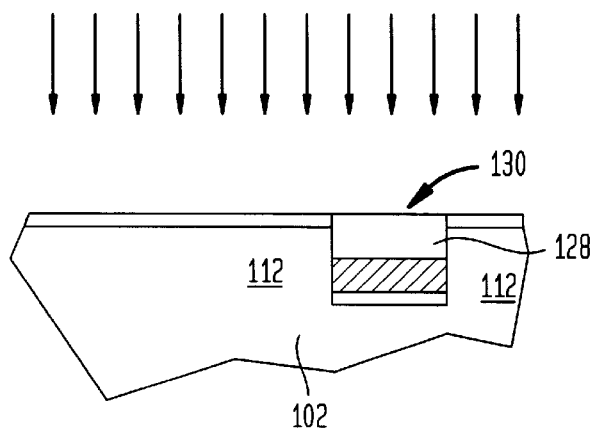
FIG. 14 is a cross-sectional view taken at section line 14—14 of FIG. 12 in accordance with the present invention.

Referring to FIGS. 12, 13 and 14, polysilicon 138 is polished to a top surface of dielectric layer 128 and filler material 112. Polysilicon 138 remains in active area region 110 to form contacts 140 between regions 114 and gate structure 130 (e.g., a wordline structure). Polysilicon 138 is implanted with dopants. For example, the dopants may include arsenic, phosphorous or boron (depending on whether an NFET or a PFET is to be formed) having a dose of between about $1\times10^{13}$ cm$^{-2}$ and about $1\times10^{16}$ cm$^{-2}$ and implanted with an energy of between about 5 and about 100 keV, depending on the dopant species used. Dopants implanted in polysilicon 138 are outdiffused into substrate 102 to form source and drain regions 142. Outdiffusion may be enhanced by performing an anneal process. For example, heating device 100 to a temperature between about 750 degrees C and about 1100 degrees C for between about 5 sec and about 60 minutes, depending on the dopant species employed and the desired degree of outdiffusion. Outdiffusion may also be permitted to occur on its own during the continued processing of device 100. In this case, no separate process step is needed. Alternately, implanted junctions (diffusion regions) may be employed by implanting dopants in substrate 102 prior to the deposition of polysilicon 138.

Referring to FIG. 15, device 100 may include array regions 150 and support regions 152. Support regions 152 include logic devices and other circuitry for supporting a memory array in array regions 150. Array regions 150 include transistors 154 and support regions 152 include transistors 156. Transistors 156 may include source and drain regions 158 which are formed by a siliciding process, implantation or by outdiffusion as described above. Contacts 160 may be formed in support regions 152 in the same way as contacts 140.

A non-critical mask may be employed to implant support region transistors 156. Implantation of dopants into diffusion regions 162 is performed by providing a non-critical mask 164 over device 100 and opening portions of mask 164 over diffusion regions 158. Dopants are implanted through polysilicon of contacts 160. Contacts 160 may remain after implantation to form raised source-drain regions.

Referring to FIG. 16, in an alternate embodiment, other contact structures may be desirable for support regions 152. In this case, polysilicon 138 may be completely removed from support regions 152 by first masking array regions 150 with a non-critical mask, and etching away contacts 160.

Figure 17:
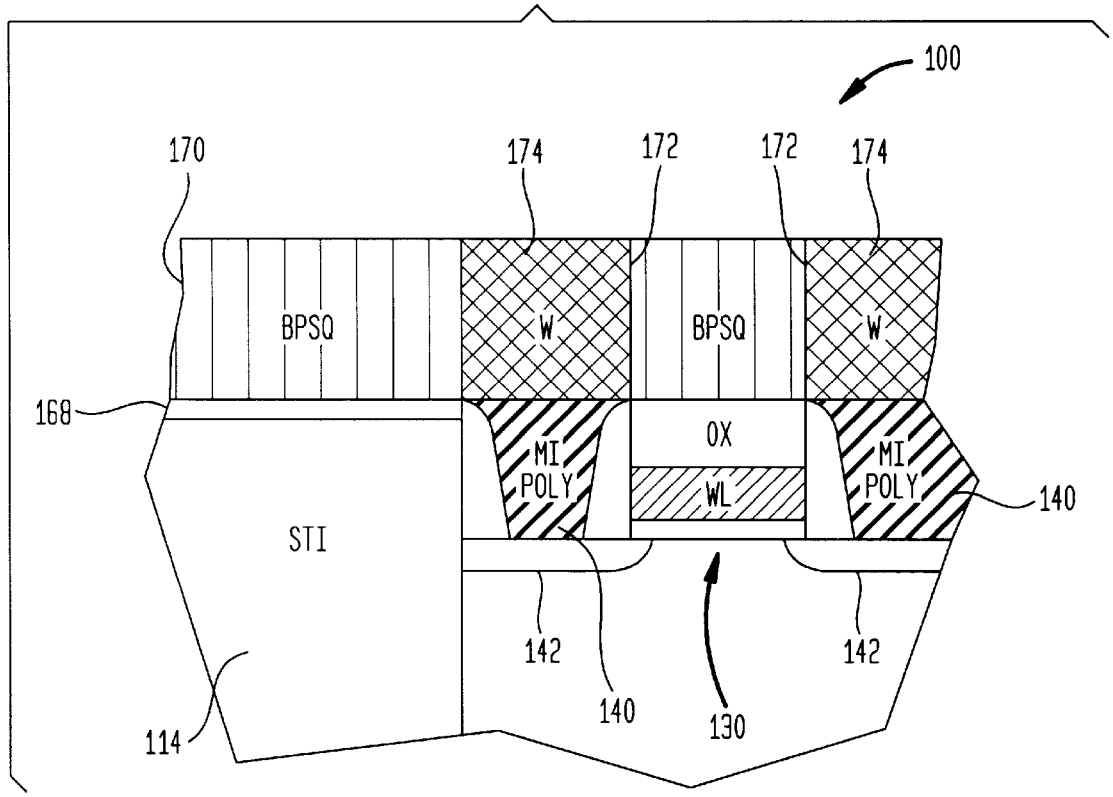
FIG. 17 is a cross-sectional view of a semiconductor device showing an interlevel dielectric layer formed and conductive material formed in vias/trenches of the interlevel dielectric layer to make electrical connections to the contacts in accordance with the present invention.

Referring to FIG. 17, a dielectric layer 168 is deposited to serve as an etch stop. Then, an interlevel dielectric layer 170 is deposited. Dielectric layer 168 is preferably a nitride while dielectric layer 170 may include an oxide such as, for example boro-phospho silicate glass (BPSG) (or other suitable insulator material). Via holes 172 are etched through dielectric layer 170 selective to dielectric layer 168. The etching, which may include a reactive ion etch, is stopped on dielectric layer 168. Then, an etch of dielectric layer 168 is performed to open via holes or trenches 172 to contacts 140.

Via holes or trenches 172 are filled with a conductive material 174 (or layers of conductive material), such as Tungsten, Aluminum, Copper, etc. which is deposited over layer 170. Conductive material 174 is then planarized to provide a suitable surface for upper dielectric layers and metal lines. Conventional processing follows, which includes additional interlevel dielectric layers, wiring conductors, vias, and/or storage capacitors.

Figure 18:
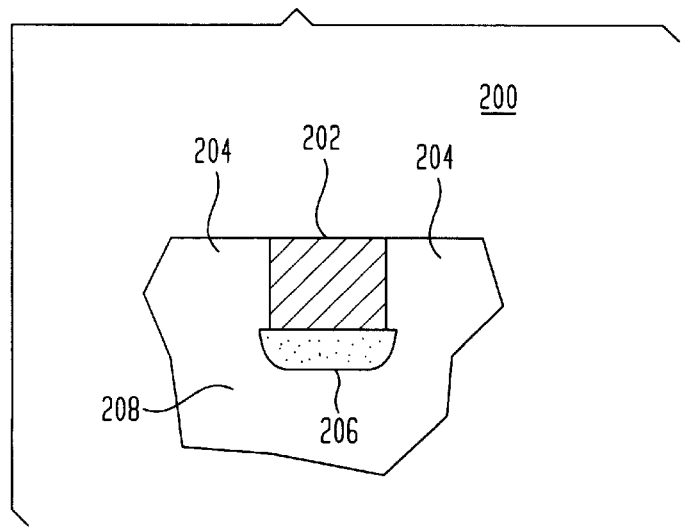
FIG. 18 is a cross-sectional view of a semiconductor device showing raised structures having a contact formed therebetween in accordance with the present invention.

Referring to FIG. 18, a borderless self-aligned contact 202 is shown for a semiconductor device 200 including raised structures 204. Raised structures 204 may include gate structures, shallow trench isolation regions, deep trench structures or other raised structures. Contact 202 is formed in accordance with the methods as set forth above. Contact 202 is self-aligned to region 206, which is preferably a diffusion region formed in a substrate 208 although a conductive line or electrode region may be employed for regions 206 and 208. Contact 202 is advantageously deposited and planarized to raised structures without the use of a masking process. This reduces complexity, saves time and reduces costs for semiconductor fabrication.

The present invention advantageously includes the following aspects:

1) Reduced bitline capacitance by use of oxide wordline spacers and protective cap (instead of conventional SiN spacers and protective cap, which have about twice the dielectric constant of oxide, thus twice the capacitance, at the same thickness), and by providing well implants which do not significantly extend under source-drain diffusions.

2) Source-Drain diffusions formed by outdiffusion from polysilicon contacts, thus avoiding implant induced defects from source-drain implants.

3) Application to both stacked and deep trench memory cells.

4) Avoidance of deep source-drain diffusions due to overetch into the shallow trench isolation. Borderless diffusion contacts of conventional DRAM processes are borderless only to the adjacent gate and do not overlap adjacent isolation regions. Misalignment of the contact mask and an active area mask, combined with contact overetch into adjacent isolation regions, may result in a deeper than desired junction forming along the sidewall of the active area silicon. A deeper junction degrades the short channel characteristics of a transistor (e.g., a metal oxide semiconductor field effect transistor (MOSFET)) formed in the active area silicon and increases the overall variation in threshold voltage of the transistor. The present invention avoids deep diffusion regions.

Having described preferred embodiments for a maskless process for self-aligned contacts (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming self-aligned borderless contacts without a masking process comprising the steps of:

forming a trench isolation region about an active area region;

forming a gate structure through the active area region, the gate structure and the trench isolation region extending above a surface of a substrate having an exposed portion of the substrate therebetween;

depositing undoped polysilicon over the gate structure, the trench isolation region and the exposed portion of the substrate;

removing the polysilicon from the gate structure and trench isolation region; and doping remaining polysilicon to form contacts in contact with the substrate.

2. The method as recited in claim 1, wherein the step of forming a gate structure includes the steps of:

depositing a first dielectric layer on a surface of the substrate;

forming a channel through the first dielectric layer down to the substrate and into the trench isolation region;

forming a gate dielectric layer on the substrate in the channel;

depositing a gate conductor on the gate dielectric layer in the channel; and forming a cap layer on the gate conductor in the channel.

3. The method as recited in claim 2, wherein the cap layer includes oxide and the step of forming a cap layer includes the step of depositing an oxide in the channel on the gate conductor and planarizing the oxide layer to form the cap layer.

4. The method as recited in claim 2, wherein the first dielectric layer includes a nitride and further comprising the step of forming a second dielectric layer on the first dielectric layer.

5. The method as recited in claim 4, wherein the second dielectric layer includes a nitride.

6. The method as recited in claim 4, wherein the step of depositing a gate conductor on the gate dielectric layer in the channel includes the steps of:

depositing the gate conductor in the channels and over the second dielectric layer;

planarizing the gate conductor from the second dielectric layer by employing the second dielectric layer as a polish or etch stop; and recessing the gate conductor into the channel.

7. The method as recited in claim 1, wherein the step of forming a gate structure includes the step of depositing an oxide on the gate conductor and etching the oxide to insulate sides of the gate conductor.

8. The method as recited in claim 7, wherein the step of depositing an oxide includes the step of oxidizing the gate conductor to further insulate sides of the gate conductor.

9. The method as recited in claim 1, further comprising the step of forming diffusion regions in the active area.

10. The method as recited in claim 9, wherein the step of forming diffusion regions in the active area includes the step of outdiffusing dopants implanted in the contacts into the substrate to form the diffusion regions.

11. The method as recited in claim 1, further comprising the steps of:

forming an etch stop layer over the contacts, shallow trench isolation region and the gate structure;

depositing an interlevel dielectric layer on the etch stop layer;

etching holes or trenches in the interlevel dielectric layer corresponding to positions of the contacts;

opening the etch stop layer over the contacts; and filling the holes or trenches with conductive material for electrically connecting to the contacts.

12. A method for forming self-aligned borderless contacts without a masking process comprising the steps of:

forming a shallow trench isolation region about an active area region;

implanting wells in a substrate in the active area region;

forming a gate structure over the active area region, the gate structure and shallow trench isolation region extending above a surface of the substrate, the substrate having an exposed portion between the gate structure and the shallow trench isolation region;

depositing undoped polysilicon over the gate structure, the shallow trench isolation region and the exposed portion of the substrate;

removing the polysilicon from the gate structure and shallow trench isolation region;

doping remaining polysilicon to form contacts in contact with the substrate; and outdiffusing dopants from the contacts into the substrate to form source and drain diffusion regions.

13. The method as recited in claim 12, wherein the step of forming a gate structure includes the steps of:

depositing a first nitride layer on a surface of the substrate;

forming a channel through the first nitride layer region down to the substrate and into the shallow trench isolation;

forming a gate oxide layer on the substrate in the channel;

depositing a gate conductor on the gate oxide layer in the channel; and forming an oxide cap layer on the gate conductor in the channel.

14. The method as recited in claim 13, further comprising the step of forming a second nitride layer on the first nitride layer.

15. The method as recited in claim 13, wherein the step of depositing a gate conductor on the gate oxide layer in the channel includes the steps of:

depositing the gate conductor in the channels and over the second nitride layer;

planarizing the gate conductor from the second nitride layer by employing the second nitride layer as a polish or etch stop; and recessing the gate conductor into the channel.

16. The method as recited in claim 12, wherein the step of forming a gate structure includes the step of depositing an oxide on the gate conductor and etching the oxide to insulate sides of the gate conductor.

17. The method as recited in claim 16, wherein the step of depositing an oxide includes the step of oxidizing the gate conductor to further insulate sides of the gate conductor.

18. The method as recited in claim 12, further comprising the steps of:

forming an etch stop layer over the contacts, shallow trench isolation region and the gate structure;

depositing an interlevel dielectric layer on the etch stop layer;

etching holes or trenches in the interlevel dielectric layer corresponding to positions of the contacts;

opening the etch stop layer over the contacts; and filling the holes or trenches with conductive material for electrically connecting to the contacts.

* * * * *